United States Patent [19]
Hong

[11] Patent Number: 5,969,386
[45] Date of Patent: Oct. 19, 1999

[54] ALUMINUM GATES INCLUDING ION IMPLANTED COMPOSITE LAYERS

[75] Inventor: Mun-pyo Hong, Kyonggi-do, Rep. of Korea

[73] Assignee: Samsung Electronics Co., Ltd., Rep. of Korea

[21] Appl. No.: 08/940,066

[22] Filed: Sep. 29, 1997

[30] Foreign Application Priority Data

Oct. 4, 1996 [KR] Rep. of Korea ............ 96-44015

[51] Int. Cl.⁶ .................................................. H01L 21/223
[52] U.S. Cl. ............... 257/347; 257/348; 257/349; 257/350; 257/351; 257/352; 257/353; 257/529; 257/530; 257/532; 257/538
[58] Field of Search ................. 257/347–353, 257/529, 530, 532, 538; 365/94, 96

[56] References Cited

U.S. PATENT DOCUMENTS

| | | | |
|---|---|---|---|
| 3,900,352 | 8/1975 | Porter | 147/187 |
| 5,557,137 | 9/1996 | Cohen | 257/530 |

OTHER PUBLICATIONS

Howard, "Limitations and Prospects of a–Si:H TFTs", Journal of the SID, vol. 3, No. 3, 1995, pp. 127–132.

Walter et al., "Nitrogen Plasma Source Ion Implantation of Aluminum", J. Vac. Sci. Technol. B 12(2), Mar./Apr. 1994, pp. 945–950.

Lewis, Sr., "Hawley's Condensed Chemical Dictionary, 12 $^{th}$ Edition", 1993, p. 303.

*Primary Examiner*—Fetsum Abraham
*Attorney, Agent, or Firm*—Myers Bigel Sibley & Sajovec

[57] ABSTRACT

An aluminum gate for a thin film transistor is fabricating by implanting ions into the exposed surface of the aluminum gate. The ions are preferably selected from the group consisting of nitrogen, carbon, oxygen and boron ions. A composite layer of aluminum and the implanted ions thereby formed at the exposed surface of the aluminum layer. Gates for thin film transistors, including an aluminum layer and a composite layer of aluminum and another element at the surface thereof can suppress hillocks in the aluminum gate which may be caused by compressive stresses during subsequent fabrication steps. The composite layer can have a low resistance and can allow a direct contact with an indium tin oxide conductive layer.

20 Claims, 6 Drawing Sheets

Fig. 3
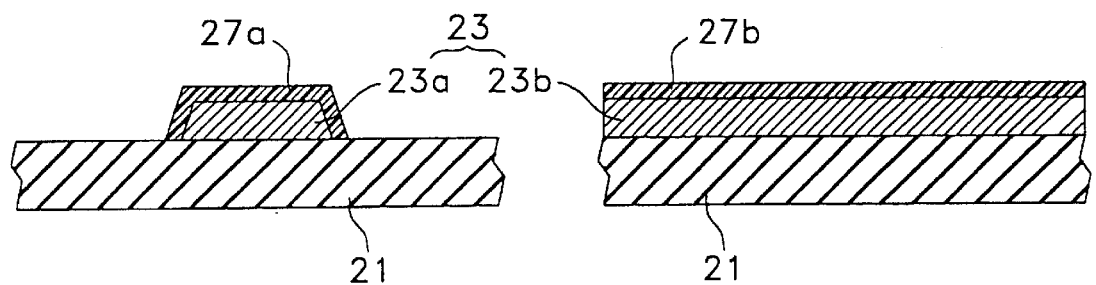
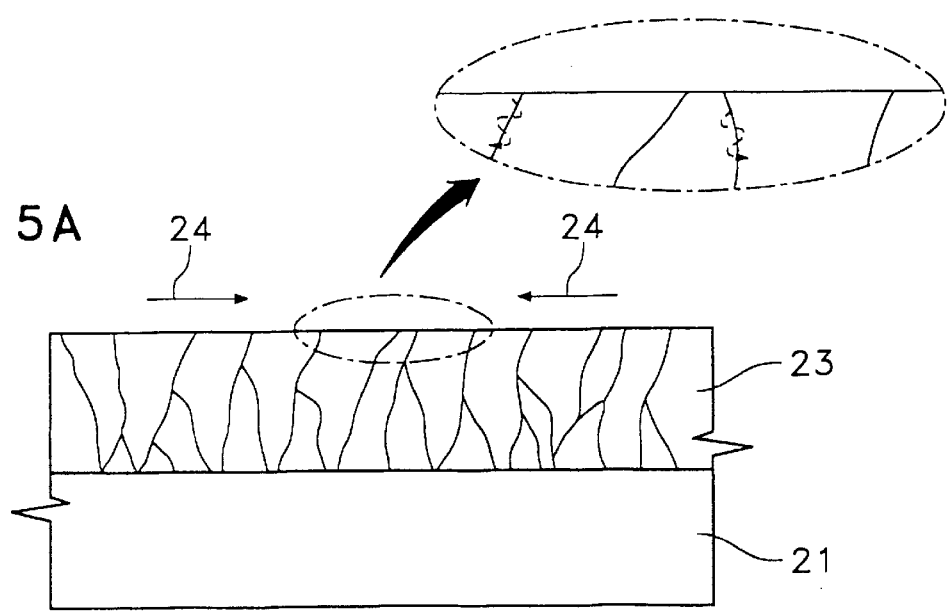
Fig. 5A
Fig. 5B 5,969,386

ALUMINUM GATES INCLUDING ION IMPLANTED COMPOSITE LAYERS

FIELD OF THE INVENTION

This invention relates to transistors such as thin film transistors and methods of fabricating the same, and more particularly to gate structures for transistors including thin film transistors and methods of fabricating the same.

BACKGROUND OF THE INVENTION

Thin film transistor-liquid crystal display (TFT-LCD) panels are widely used flat panel display devices. As the integration density and size of the TFT-LCD panels increase, it may become increasingly important to provide low resistivity gate lines and data lines for the panel. Accordingly, aluminum is being widely investigated for the gate lines and data lines of the TFT-LCD panels.

Currently, 22" diagonal size panels may be obtained from 370×470 mm$^2$ mother glass panels. It has been confirmed that aluminum can be used for these panels without degradation of display quality. See the publication entitled "*Limitation and Prospects of a-Si:H TFTs*", by W. E. Howard, Journal of the SID, Vol. 3, No. 3, p. 127 (1995). In this publication, it is estimated that pure aluminum can be used for up to 30" diagonal size panels. This suggests that aluminum metalization can be used for even larger size panel fabrication, such as third generation mother glass panels of 550×650 mm$^2$ in size.

Unfortunately, pure aluminum may have problems which may limit its suitability for TFT-LCD panels. For example, as shown in FIG. 1, when a pure aluminum layer 3 is deposited on a substrate 1, for example a transparent substrate for a TFT-LCD, using sputtering, the grains 3a of pure aluminum may grow in a columnar grain structure. During subsequent fabrication steps, subsequent layers or subsequent fabrication conditions may place the aluminum layer 3 under compressive stress, as shown by arrows 4. As a result of the compressive stress, grains 3a may extend from the planar surface of the pure aluminum layer 3 and may thereby form hillocks thereon.

Moreover, in subsequent processing, the pure aluminum layer 3 may be subject to a wet etch of an indium tin oxide (ITO) layer, which is generally used as a transparent conductive layer in a TFT-LCD. This etch may cause a chemical attack on the pure aluminum layer. Moreover, since the pure aluminum layer has a strong affinity for oxygen, electrochemical corrosion may occur between the pure aluminum layer and the ITO layer. Accordingly, the pure aluminum layer should not directly contact the ITO layer. One or more of these shortcomings can therefore degrade the quality and yield of the TFT-LCDs. As such, pure aluminum is often not used, despite the potential advantages thereof.

In order to obviate one or more of the above shortcomings, it is known to carefully select the gate insulator that overlies the aluminum layer. Generally, the gate insulator includes a double insulator structure to protect the surface of the aluminum layer. The double insulator structure is generally formed of a first gate insulator of anodized aluminum and a second insulator of a chemical vapor deposited nitride film.

FIGS. 2A through 2F, illustrate a conventional method for fabricating a TFT-LCD in which an anodization is used. As shown in FIG. 2A, a transparent substrate 1 for a TFT-LCD, such as a glass substrate, is provided. Thereafter, a pure Al layer 3 is deposited on the substrate 1 to a predetermined thickness by sputtering. The deposition of the pure Al is followed by respectively patterning the pure Al layer 3 to form a TFT gate pattern 3b, a gate line pattern and a first contact pattern 3c in a gate pad area. It will be understood that the gate pattern 3b and the first contact pattern 3c are interconnected by the gate line pattern to form a TFT-LCD body.

Thereafter, a photoresist layer 5 that serves as an anodized mask layer is formed only on the first contact pattern 3c of the gate pad area by a conventional photo-imaging process, as shown in FIG. 2b. An anodized layer 7 of Al$_2$O$_3$ is formed to a thickness ranging from 1500Å to 2000Å only on the surface of the gate pattern 3b and on the gate line by anodizing. The anodization layer 7 is used for the first gate insulator.

As shown in FIG. 2C, after removing the photoresist layer 5, amorphous nitride 9 that is used for the second gate insulator, amorphous silicon 11 and n$^+$ amorphous silicon 13 are successively deposited on the substrate using CVD. Thereafter, photolithography is used to form the active layer only on the gate pattern 3b, which includes an amorphous silicon layer 11 and an n$^+$ amorphous silicon layer 13. As a result, only the amorphous nitride 9 is left on the contact pattern 3b.

As shown in FIG. 2D, the amorphous nitride 9 on the first contact pattern 3c is then patterned to leave only an inner portion thereof, using a photolithographic process. As a result, the outer portion of the first contact pattern 3c, from which the amorphous nitride is removed, is exposed.

As shown in FIG. 2E, a metal layer 15, such as a chrome layer, is deposited to a predetermined thickness by sputtering. The metal layer 15 is patterned to form a data line pattern 15a and a second contact pattern 15b on the n$^+$ amorphous silicon layer 13 and on the first contact pattern 3c, respectively, using photolithography. This divides the data line pattern 15a into a source line pattern and a drain line pattern. The surface of the n$^+$ amorphous silicon layer 13 between the divided patterns of the data line pattern 15a is exposed. The second contact pattern 15b of chrome comes into direct contact with the first contact pattern 3c of Al.

Thereafter, the exposed area of the n$^+$ amorphous silicon layer 13 is etched. The amorphous silicon 11 may also be etched to a predetermined depth.

As shown in FIG. 2F, a protective layer 17, such as a nitride layer, is deposited on the substrate 1 by CVD. A contact hole 18 is then formed in the protective layer 17 by a photolithographic process. Upon completion of the contact hole 18, an ITO layer 19 or other transparent conductor is deposited on the protective layer 17. Thereafter, the transparent conductor 19 is patterned by photolithography to form a pixel electrode pattern. As a result, the transparent conductor 19 comes into direct contact with the data line pattern 15a through the contact hole 18.

The resultant TFT-LCD has a thick and dense anodized layer 7 such as an Al$_2$O$_3$ ceramic insulator having a thickness ranging from 1500Å to 2000Å on the surface of the gate pattern 3b. This anodized layer can suppress hillock formation.

However, if the Al layer of the contact pattern of the gate pad is anodized during the anodization process, the Al layer may not directly contact the ITO layer in the contact pattern. An additional photolithography process may be required to prevent the Al layer of the contact pattern from anodizing, which can complicate the fabrication process and can result in increased cost. Moreover, the anodized layer may have a relatively high resistance.

Accordingly, to simplify the process of the gate line formation for TFT-LCD, the use of double layered gate metals having an Al-alloy and a refractory metal is being considered. Al-Zr, Al-Ta and/or Al-Ti can be used for the Al-alloy, and Mo, Cr, Ta and other refractory metals can be used. The double layered gate metals are nearly hillock free and can have resistance of approximately $10\mu\Omega Cm$ after annealing at 400° C.

However, the double layered gate metals may have more than three times the resistivity of pure Al, and are especially chemically vulnerable against photoresist stripper and ITO etchant. Moreover, a so called "splash" problem may produce alloy clusters in the deposited Al-alloy film. Thus, double layered gate metals are capable of suppressing hillock formation in an Al gate line to some extent, but may not be suitable for the next generation TFT-LCD panels.

SUMMARY OF THE INVENTION

It is therefore an object of the present invention to provide aluminum gates and thin film transistors which can reduce hillock formation therein.

It is another object of the present invention to provide methods of fabricating aluminum gates and thin film transistors having reduced susceptibility to hillock formation.

These and other objects are provided, according to the present invention, by implanting ions into the exposed surface of an aluminum gate layer. The ions are preferably selected from the group consisting of nitrogen, carbon, oxygen and boron ions. The ions may be implanted into the face of the aluminum gate layer, opposite the substrate, and also may be implanted into the pair of sidewalls in the aluminum gate layer between the face and the substrate. The aluminum gate layer may be pure aluminum or aluminum alloys.

The implanted ions form a composite layer of aluminum and nitrogen, aluminum and carbon, aluminum and boron, or aluminum and oxygen. As is well known to those having skill in the art, a composite layer is a mixture or mechanical combination on a macro scale of two or more materials that are solid in the finished state, are mutually insoluble, and differ in chemical nature. See *Hawley's Condensed Chemical Dictionary*, $12^{th}$ *Edition*, 1993, p. 303.

The composite layer can suppress hillock formation, to thereby increase the reliability and yield of the TFT-LCD. Moreover, a photolithography process for masking the contact pattern of the gate pad area can be eliminated, to thereby simplify the process. Finally, the ceramic composite layer that is formed on the aluminum gate can suppress the formation of a high resistivity oxidation layer between the aluminum layer and the indium tin oxide layer which was previously caused when the ITO layer was in direct contact with the aluminum layer. Therefore, the gate contact pattern can be in direct contact with the ITO layer.

It is known that Al can be modified by ion implantation for various applications where high wear resistance and low weight are desired. See the publications entitled "*Nitrogen Plasma Source Ion Implantation of Aluminum*" and "*Structure and Wear Behavior of Nitrogen-Implanted Aluminum Alloys*", J. Vac. Sci. Technol. B 12(2), March/April 1994. These publications note that engineering applications of Al are often limited by aluminum's low hardness, strength and corresponding low wear resistance, but surface modification of Al by ion implantation offers the possibility of using Al in applications where a combination of high wear resistance and low weight is required. Furthermore, ion implantation, a near room temperature process, may be able to independently optimize surface properties without changing the bulk properties because of the low melting point (600° C.) of Al and Al-alloys. However, ion implanted aluminum does not appear to have been heretofore considered for gates of TFT-LCD structures to solve the hillock formation and other problems described above.

Thin film transistors according to the invention include a thin film transistor substrate and an aluminum gate on the thin film transistor substrate. The aluminum gate includes an exposed surface and contains ions therein adjacent the exposed surface. The ions may form a composite layer of aluminum and at least one other element on the aluminum layer. A channel layer is included on the exposed surface, opposite the substrate, and spaced apart source and drain regions are included on the channel layer opposite the aluminum layer. The ions are selected from the group consisting of nitrogen, carbon, oxygen and boron ions, as already described, and may be included on the face and optionally on the sidewalls. High performance, high reliability aluminum gate transistors are thereby provided.

BRIEF DESCRIPTION OF THE DRAWINGS

FIG. 3 is a cross-sectional view of an embodiment of TFT Al gate structures that can suppress hillock formation according to the present invention;

FIG. 5 is an illustration of columnar grain growth and hillock formation in TFT Al gates according to the present invention;

DETAILED DESCRIPTION OF PREFERRED EMBODIMENTS

Figure 1:
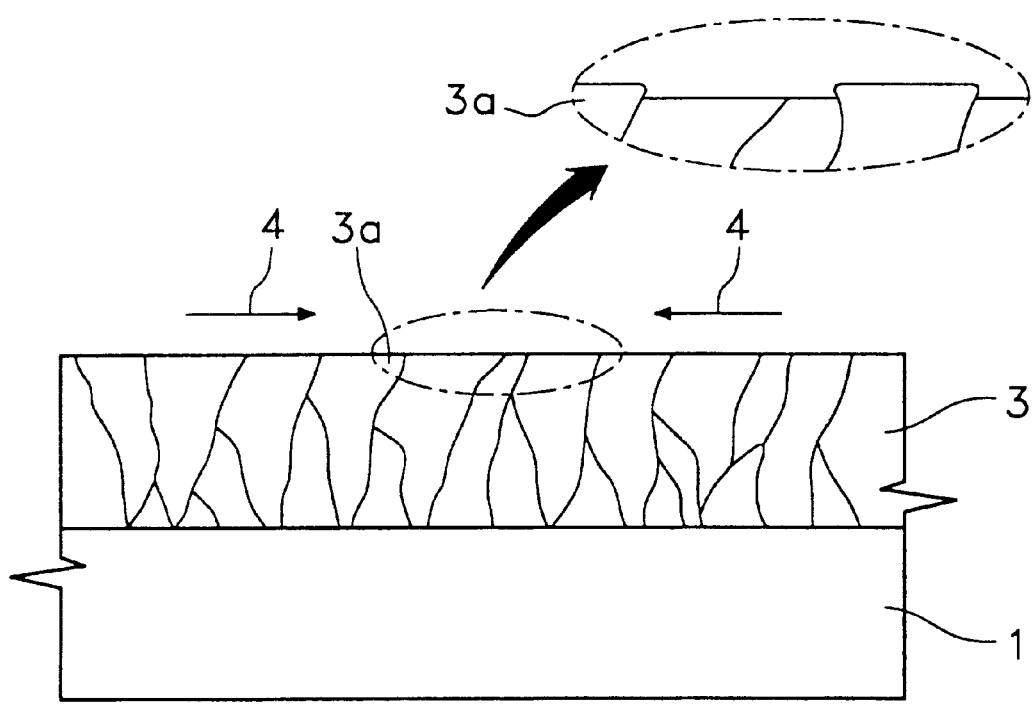
FIG. 1 is an illustration of columnar grain growth and hillock formation in a conventional TFT-LCD Al gate.
Figure 2A:
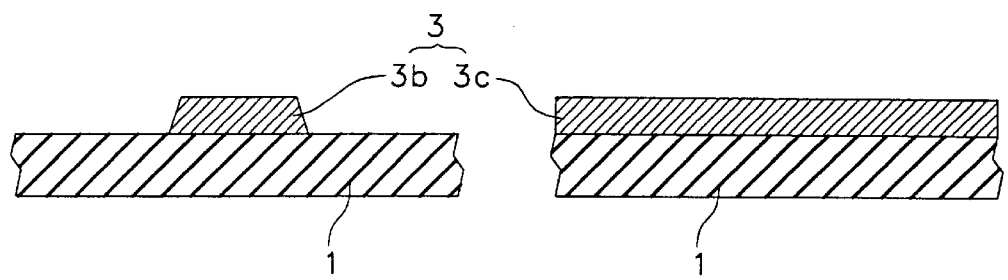
FIGS. 2A through 2F, illustrate a conventional method for fabricating a TFT-LCD to which an anodization is applied.
Figure 2B:
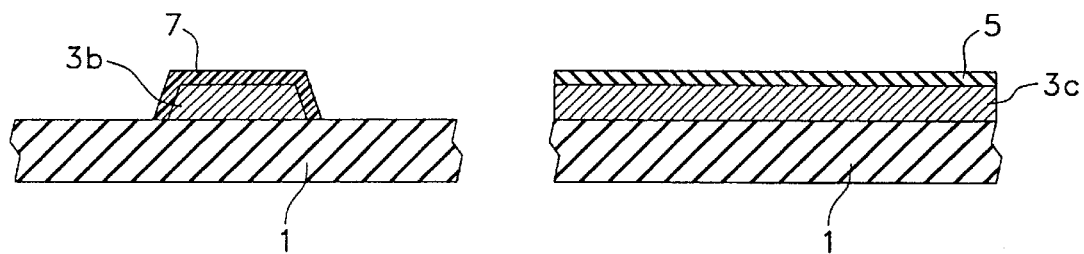
Figure 2C:
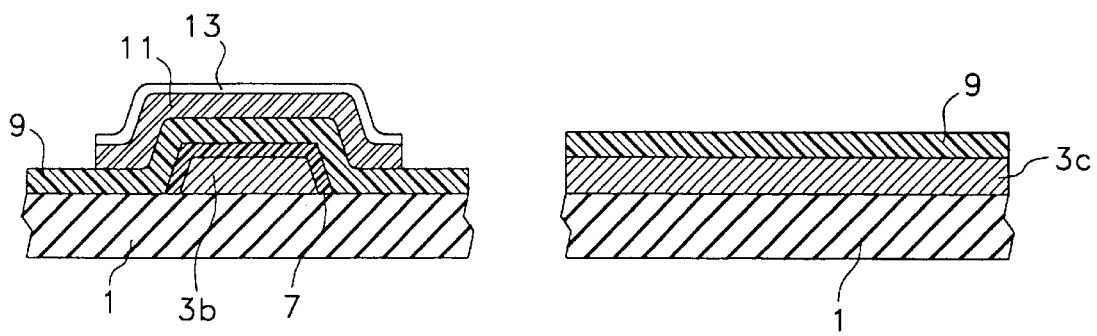
Figure 2D:
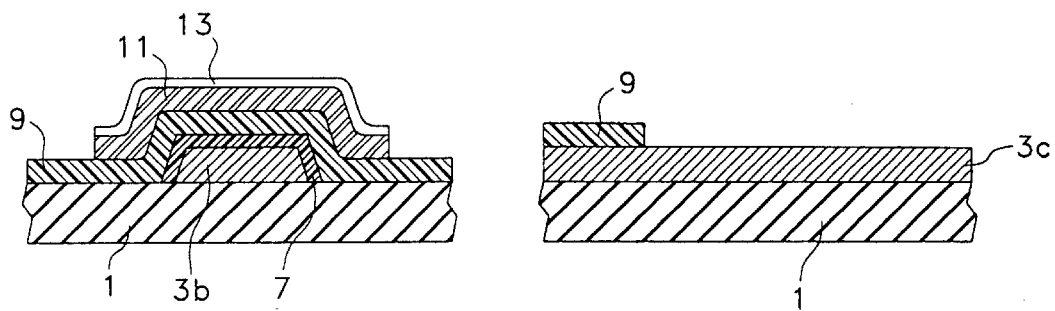
Figure 2E:
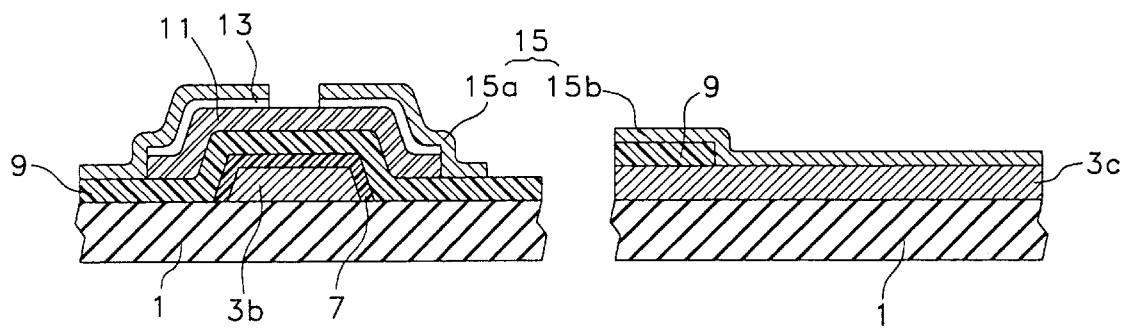
Figure 2F:
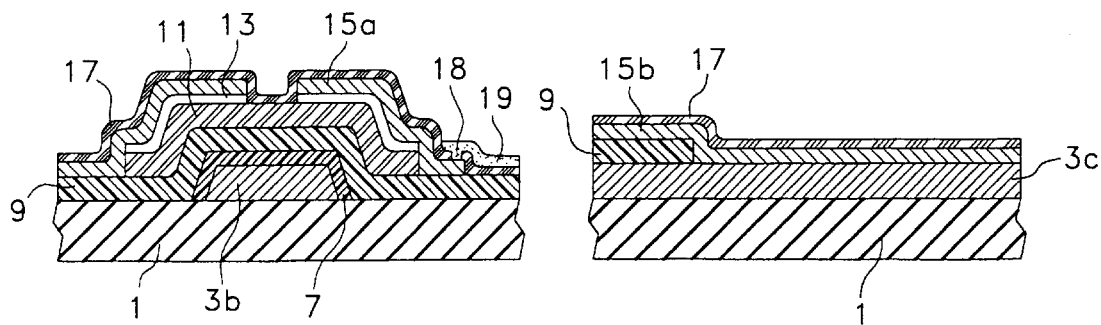

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

FIG. 3 is a cross-sectional view of an embodiment of TFT Al gate structures that can suppress hillock formation according to the present invention. As shown in the drawing, a gate pattern 23*a* is included on the pixel area of substrate 21. A composite ceramic insulating layer 27*a* that can suppress hillock formation is included on gate pattern 23*a*. A contact pattern 23*b* is included on the gate pad area of the substrate 21. A composite ceramic insulating layer 27b is included on the surface of the Al contact pattern 23b.

The gate pattern 23b and the contact pattern 23b are formed of pure Al or Al-alloy. The ceramic insulating layers 27a and 27b are formed of a material selected from the group consisting of Al-N, Al-C, Al-B and Al-O composite materials.

Figure 4A:
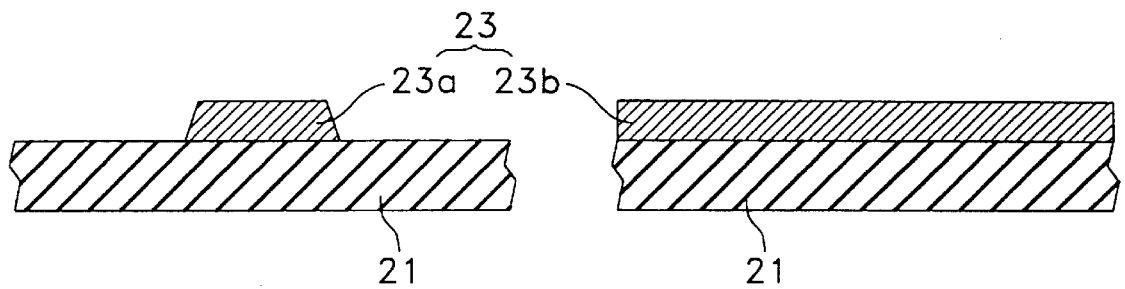
FIGS. 4A through 4C illustrate methods of fabricating TFT Al gate structures of FIG. 3.
Figure 4B:
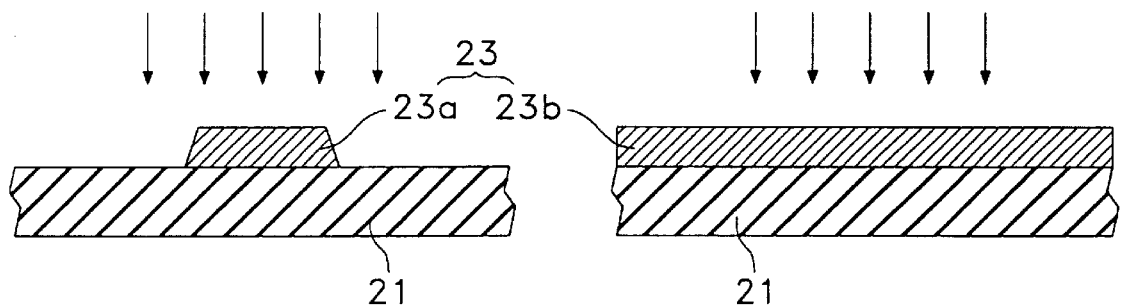
Figure 4C:
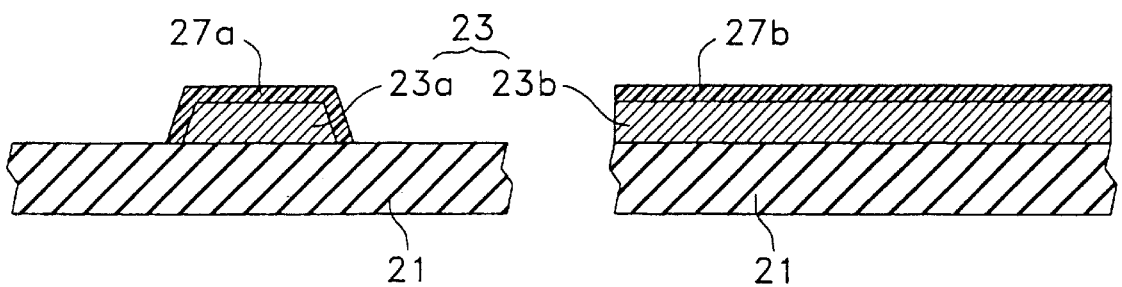

Methods for fabricating TFT Al gate structures are shown in FIGS. 4A through 4C. Referring to FIG. 4A, a transparent substrate 21, such as a glass substrate for a TFT-LCD, is prepared. A pure Al layer 23 is deposited to a predetermined thickness on the surface of the substrate 21 by sputtering. During the deposition, the grains of the pre Al layer 23 grow in columnar grain structures as shown in FIG. 5. Al-alloys may also be used instead of pure Al.

Thereafter, the Al layer 23 is patterned by a photolithographic process to form a TFT gate pattern 23a, a gate line pattern (not shown) and a contact pattern 23b in the gate pad area, respectively. It will by understood by those of skill in the art that the gate pattern 23a and the first contact pattern 23b are interconnected by the gate line pattern to form a TFT-LCD body.

As shown in FIGS. 4B and 4C, nitrogen ions are implanted into the surface of the substrate 21 including the gate pattern 23a and the contact pattern 23b. Implantation may be performed at room temperature by a general linear beam ion implantation technique, by an ion shower technique, or by a Plasma Source Ion Implantation (PSII) technique. As a result, composite ceramic insulating layers of Al-N 27a and 27b are respectively formed on the surface of the gate pattern 23a, the gate line pattern and the contact pattern 23b. As shown in FIG. 4C, composite layer 27a is formed on the face of the aluminum gate pattern 23a opposite substrate 21, and on the sidewalls of the aluminum gate pattern 23a, between the face and the substrate.

More particularly, the implanted nitrogen ions mix the columnar grain boundaries on the surface of the gate pattern 23a, on the gate line (not shown) and on the contact pattern 23b, as illustrated by dotted arrows in FIG. 5. Therefore, although the pure Al layer 23 is placed under compressive stress 24 by various overlaying layers (not shown) during or after the deposition process, extrusion of the columnar grains may be suppressed, and hillock formation can also be reduced.

The nitrogen generally has a Gaussian distribution from the surface of the gate pattern 23a, the gate line and the contact pattern 23b to the inside thereof. Thus, most of the nitrogen ions exist at the surface. As a result, the surface of the gate pattern 23a, the gate line and the contact pattern 23b are nitrified.

The surface hardness and resistance against oxidation of the Al layer 23, and the resistivity of the composite layer 27 may be controlled by ion implantation dose and ion implantation energy. It is preferable that the total ion implantation dose is in the range of $10^{16}$–$10^{18}$/Cm$^2$ and the ion implantation energy is in the range of 10–100 KeV. The temperature of the substrate 21 is not limited to ambient temperature, and it can be varied within the TFT-LCD process temperature limitations.

As the total nitrogen ion implantation dose and the energy increase, or the temperature of the substrate goes up, the Al-N composite layer generally grows thicker and denser. This may result in high surface hardness, but may also result in increased electric resistance. Therefore, ion implantation should be controlled so that the Al-N layer is capable of suppressing hillock formation, but does not exceed the limitation of contact resistance of the contact pattern 23b and the following chrome layer or other metal layer.

The rest of the fabrication process for the TFT is the same as conventional processes, and need not be described again.

Carbon, oxygen, boron, as well as nitrogen and combinations thereof can be used for the ion implantation. The composite ceramic insulating layers 27a and 27b thus can be Al-C, Al-O and/or Al-B instead of Al-N.

Figure 6:
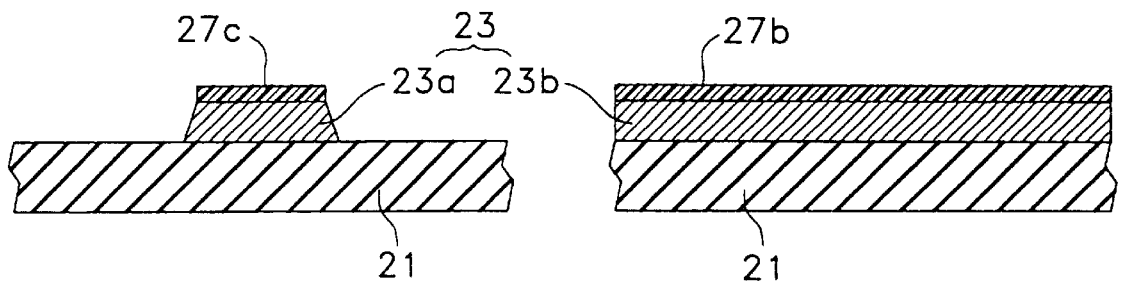
FIG. 6 is a cross-sectional view of another embodiment of TFT Al gate structures that can suppress hillock formation according to the present invention.

Another embodiment of TFT Al gate structures for suppressing hillock formation and methods for fabricating the same according to the invention will now be described. Referring to FIG. 6, the structure is the same as the structure in FIG. 3 except that a ceramic insulating layer 27c is formed only on the face (the top in FIG. 6) of the Al gate pattern 23a. The ceramic insulating layer 27c is not formed on the sidewalls of the gate pattern 23a.

Figure 7A:
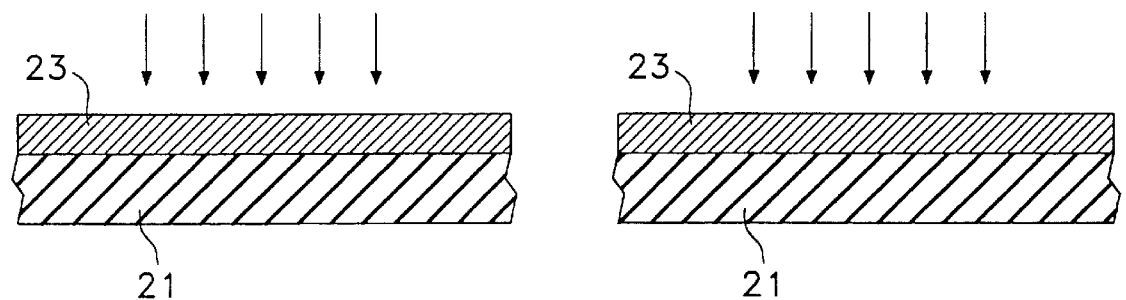
FIGS. 7A and 7B illustrate methods for fabricating the TFT Al gate structure of FIG. 6.

Methods for fabricating such TFT Al gate structures will be described referring to FIGS. 7A and 7B. Referring to FIG. 7A, a pure Al layer 23 is deposited a predetermined thickness on a substrate 21 by sputtering. Thereafter, nitrogen ions are implanted into the surface of the Al layer 23, for example using a linear beam ion implantation technique, an ion shower technique or a PSII technique as was described in connection with FIG. 4B.

Figure 7B:
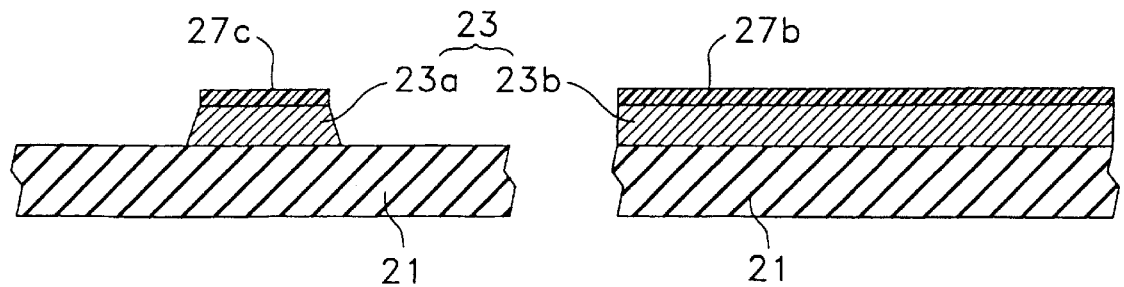

As shown in FIG. 7B, the ion implanted Al layer 23 is patterned to respectively form a TFT gate pattern 23a, a gate line pattern (not shown) and a contact pattern 23b of a gate pad area in the same photolithographic process used for forming the structure in FIG. 4B. Thus, a composite ceramic insulating layer of AlN 27c is formed only on the face of the gate pattern 23a and on the surface of the gate line. The remaining process steps are the same as conventional TFT fabricating methods, and need not be described again.

As before, carbon, oxygen, boron, as well as nitrogen may be used for the ion implantation. Thus, the composite ceramic insulating layers 27b and 27c may be formed of Al-C, Al-O and/or Al-B instead of Al-N.

As aforementioned, nitrogen ions, carbon ions, boron ions, and oxygen ions may be implanted into the Al layer either after or before patterning the Al layer to form a gate pattern, a contact pattern of a gate pad area and a gate line pattern. As a result, a composite ceramic insulating layer such as Al-N, Al-C, Al-B and Al-O is formed on the surface of the Al layer.

Accordingly, the invention can enhance the reliability of TFT-LCD by forming a composite ceramic insulating layer such as Al-N, Al-C, Al-B and Al-O that can suppress hillock formation and can have low resistance on the surface of the Al gate line. It is also possible to simplify the process by omitting an additional photolithography step for masking a contact pattern of the gate pad area. Moreover, direct contact between the contact pattern of the gate pad area and the ITO layer is possible, because the ceramic insulating layer on the surface of the Al gate may have high resistance against oxidation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A gate for a transistor comprising:

an aluminum layer on a substrate, the aluminum layer including an exposed surface, the aluminum layer containing therein ions adjacent the exposed surface and not containing therein the ions remote from the exposed surface.

2. A gate according to claim 1 wherein the ions are selected from the group consisting of nitrogen, carbon, oxygen and boron ions.

3. A gate according to claim 1 wherein the aluminum layer includes a face, opposite the substrate, and a pair of sidewalls between the face and the substrate, and wherein the ions are contained in the aluminum layer adjacent the face and adjacent the pair of sidewalls.

4. A gate according to claim 1 wherein the aluminum layer includes a face, opposite the substrate, and a pair of sidewalls between the face and the substrate, and wherein the ions are contained in the aluminum layer adjacent the face, but are not contained in the aluminum layer adjacent the sidewalls.

5. A gate according to claim 1 wherein the aluminum layer is an aluminum alloy layer.

6. A gate for a transistor comprising:

an aluminum layer on a substrate; and a composite layer of aluminum and at least one other element directly on the aluminum layer.

7. A gate according to claim 6 wherein the at least one other element is selected from the group consisting of nitrogen, carbon, oxygen and boron.

8. A gate according to claim 6 wherein the aluminum layer includes an outer face, opposite the substrate, and a pair of sidewalls between the outer face and the substrate, and wherein the composite layer is directly on the outer face and directly on the pair of sidewalls.

9. A gate according to claim 6 wherein the aluminum layer includes an outer face, opposite the substrate, and a pair of sidewalls between the outer face and the substrate, and wherein the composite layer is directly on the outer face, but not on the sidewalls.

10. A gate according to claim 6 wherein the aluminum layer is an aluminum alloy layer.

11. A thin film transistor comprising:

a thin film transistor substrate;

an aluminum gate on the thin film transistor substrate, the aluminum gate including an exposed surface, the aluminum gate containing therein ions adjacent the exposed surface;

a channel layer on the exposed surface, opposite the substrate; and spaced apart source and drain regions on the channel layer opposite the aluminum gate.

12. A transistor according to claim 11 wherein the ions are selected from the group consisting of nitrogen, carbon, oxygen and boron ions.

13. A transistor according to claim 11 wherein the aluminum gate includes a face, opposite the substrate, and a pair of sidewalls between the face and the substrate, and wherein the ions are contained in the aluminum gate adjacent the face and adjacent the pair of sidewalls.

14. A transistor according to claim 11 wherein the aluminum gate includes a face, opposite the substrate, and a pair of sidewalls between the face and the substrate, and wherein the ions are contained in the aluminum gate adjacent the face, but are not contained in the aluminum layer adjacent the sidewalls.

15. A transistor according to claim 11 wherein the aluminum gate is an aluminum alloy gate.

16. A thin film transistor comprising:

a thin film transistor substrate;

an aluminum gate on the thin film transistor substrate;

a composite layer of aluminum and at least one other element directly on the aluminum gate;

a channel layer on the composite layer, opposite the substrate; and spaced apart source and drain regions on the channel layer opposite the aluminum gate.

17. A transistor according to claim 16 wherein the at least one other element is selected from the group consisting of nitrogen, carbon, oxygen and boron.

18. A transistor according to claim 16 wherein the aluminum gate includes an outer face, opposite the substrate, and a pair of sidewalls between the outer face and the substrate, and wherein the composite layer is directly on the outer face and on the pair of sidewalls.

19. A transistor according to claim 16 wherein the aluminum gate includes an outer face, opposite the substrate, and a pair of sidewalls between the outer face and the substrate, and wherein the composite layer is directly on the outer face, but not on the sidewalls.

20. A transistor according to claim 16 wherein the aluminum gate is an aluminum alloy gate.

* * * * *

UNITED STATES PATENT AND TRADEMARK OFFICE
CERTIFICATE OF CORRECTION

PATENT NO. : 5,969,386
DATED : October 19, 1999
INVENTOR(S) : Mun-pyo Hong

It is certified that error appears in the above-identified patent and that said Letters Patent is hereby corrected as shown below:

Column 4, line 33, please delete "FIG. 5" and substitute -- FIG. 5A -- therefor.
Column 4, line 36, please insert -- FIG. 5B is an enlarged view of the illustration of columnar grain growth and hillock formation in TFT Al gates of FIG. 5A. --
Column 5, line 39, please delete "FIG. 5" and substitute -- FIG. 5A and in the enlarged view of FIG. 5B -- therefor.

Signed and Sealed this

Sixteenth Day of May, 2000

Attest:

Q. TODD DICKINSON

*Attesting Officer*            *Director of Patents and Trademarks*